US007283073B2

United States Patent
Chen

(10) Patent No.: US 7,283,073 B2
(45) Date of Patent: Oct. 16, 2007

(54) SYSTEM FOR SPEEDING UP THE ARITHMETIC CODING PROCESSING AND METHOD THEREOF

(75) Inventor: Pei-Chung Chen, Taipei (TW)

(73) Assignee: Primax Electronics Ltd., Taipei (TW)

( * ) Notice: Subject to any disclaimer, the term of this patent is extended or adjusted under 35 U.S.C. 154(b) by 25 days.

(21) Appl. No.: 11/305,013

(22) Filed: Dec. 19, 2005

(65) Prior Publication Data

US 2007/0139234 A1    Jun. 21, 2007

(51) Int. Cl.
*H03M 7/00* (2006.01)

(52) U.S. Cl. .................. 341/107; 51/106; 382/232; 382/244; 382/247

(58) Field of Classification Search .................. 341/107

See application file for complete search history.

(56) References Cited

U.S. PATENT DOCUMENTS

| | | | | | |
|---|---|---|---|---|---|
| 5,059,976 | A | * | 10/1991 | Ono et al. | 341/51 |
| 5,418,863 | A | * | 5/1995 | Ando | 382/232 |
| 5,587,710 | A | * | 12/1996 | Choo et al. | 341/107 |
| 6,075,471 | A | * | 6/2000 | Kimura et al. | 341/107 |
| 6,081,213 | A | * | 6/2000 | Hosaka | 341/107 |
| 6,549,665 | B1 | * | 4/2003 | Hirao | 382/232 |
| 6,553,144 | B1 | * | 4/2003 | Hirao et al. | 382/239 |
| 6,825,782 | B2 | * | 11/2004 | Bossen | 341/107 |

* cited by examiner

*Primary Examiner*—Khai M. Nguyen
(74) *Attorney, Agent, or Firm*—Harness, Dickey & Pierce, P.L.C.

(57) ABSTRACT

A system for speeding up the arithmetic coding processing and method thereof is used in a calculating method in which when the input data are two successive same pixel values and the context values (CX) thereof. The output interval size A and base C are determined by adding a set of operation circuits and a set of speed-up tables, such that the A, C values which needed two clock cycles previously may be calculated within a clock cycle, thereby achieving the object of speeding up the arithmetic coding processing.

10 Claims, 17 Drawing Sheets

| ST | LSZ | NLPS | NMPS | SWTCH | ST | LSZ | NLPS | NMPS | SWTCH |
|---|---|---|---|---|---|---|---|---|---|
| 0  | 0x5a1d | 1  | 1  | 1 | 57 | 0x01a4 | 55 | 58 | 0 |
| 1  | 0x2586 | 14 | 2  | 0 | 58 | 0x0160 | 56 | 59 | 0 |
| 2  | 0x1114 | 16 | 3  | 0 | 59 | 0x0125 | 57 | 60 | 0 |
| 3  | 0x080b | 18 | 4  | 0 | 60 | 0x00f6 | 58 | 61 | 0 |
| 4  | 0x03d8 | 20 | 5  | 0 | 61 | 0x00cb | 59 | 62 | 0 |
| 5  | 0x01da | 23 | 6  | 0 | 62 | 0x00ab | 61 | 63 | 0 |
| 6  | 0x00e5 | 25 | 7  | 0 | 63 | 0x008f | 61 | 32 | 0 |
| 7  | 0x006f | 28 | 8  | 0 | 64 | 0x5b12 | 65 | 65 | 0 |
| 8  | 0x0036 | 30 | 9  | 0 | 65 | 0x4d04 | 80 | 66 | 0 |
| 9  | 0x001a | 33 | 10 | 0 | 66 | 0x412c | 81 | 67 | 1 |
| 10 | 0x000d | 35 | 11 | 0 | 67 | 0x37d8 | 82 | 68 | 0 |
| 11 | 0x0006 | 9  | 12 | 0 | 68 | 0x2fe8 | 83 | 69 | 0 |
| 12 | 0x0003 | 10 | 13 | 0 | 69 | 0x293c | 84 | 70 | 0 |
| 13 | 0x0001 | 12 | 13 | 0 | 70 | 0x2379 | 86 | 71 | 0 |
| 14 | 0x5a7f | 15 | 15 | 1 | 71 | 0x1edf | 87 | 72 | 0 |
| 15 | 0x3f25 | 36 | 16 | 0 | 72 | 0x1aa9 | 87 | 73 | 0 |
| 16 | 0x2cf2 | 38 | 17 | 0 | 73 | 0x174c | 72 | 74 | 0 |

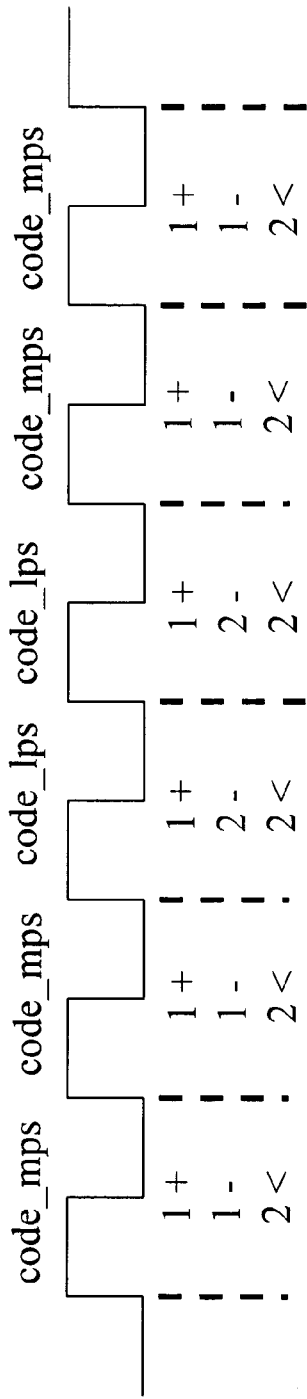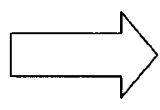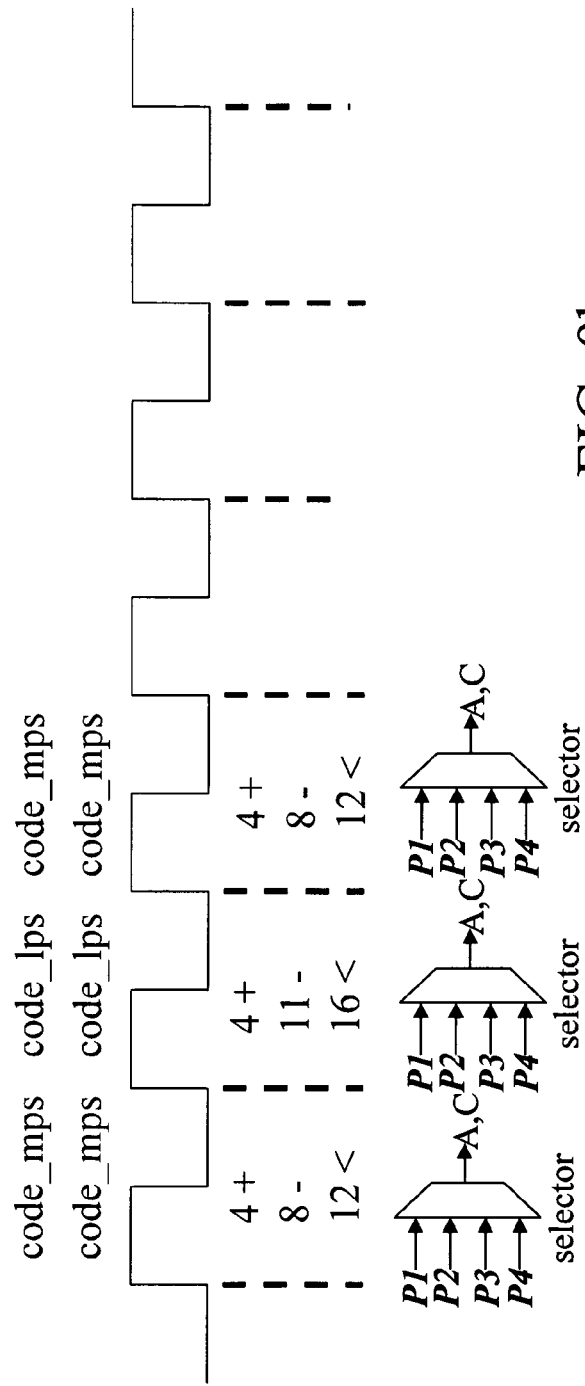
FIG. 9a (prior art)
FIG. 9b

| | Hit Rate | Timing Improvement | H/W Cost | Table |
|---|---|---|---|---|
| 1 pixel | 100% | 1x | MPS+LPS (2+, 3-, 4<) | 1 PE Table (128 Word) |
| 2 pixels | ~50% | Max. 2x Faster Average 1.3x Faster | MPS+LPS (8+, 19-, 28<) | 1 PE Table (128 Word) 1 Speed-up Table (1K Byte) |
| 3 pixels | ~24% | Max. 3x Faster Average 1.2x Faster | MPS+LPS (16+, 39-, 56<) | 1 PE Table (128 Word) 1 Speed-up Table (2K Byte) |
| 4 pixels | ~13% | Max. 4x Faster Average 1.1x Faster | MPS+LPS (24+, 59-, 84<) | 1 PE Table (128 Word) 1 Speed-up Table (4K Byte) |

FIG. 11

SYSTEM FOR SPEEDING UP THE ARITHMETIC CODING PROCESSING AND METHOD THEREOF

BACKGROUND OF THE INVENTION

1. Field of the Invention

The present invention relates to a system for speeding up the arithmetic coding processing and method thereof, and more particularly, to a system used in the JBIG (Joint Bi-level Image Experts Group) for compressing a bi-level image data and method thereof.

2. Related Art

In the present society with universal information flow, as the quantity demanded for images is becoming larger and larger, the digitization of images is a necessary trend. However, the digitized image has a great amount of data and occupies too much memory, such that it takes a lot of time in data transmission and processing, and is also inconvenient. It is a perfect solution to compress the data.

The image data compression techniques have a wide application foreground. It can be said that, all the digital image products are involved in the image data compression techniques, and the digitization of the electronic products is the general trend. For example, high-definition digital televisions will replace the analog televisions, video telephones will replace the traditional voice telephones, and digital cameras will replace the film cameras, and so on.

The invention and wide use of the facsimile technology promote the quick development of the bi-level image compression algorithm. CCITT (Consultative Committee for International Telegraph and Telephone, an institution of the International Telecommunication Union (ITU)) establishes a series of image compression standards for the fax-like applications, exclusively- used in compressing and delivering bi-level images. These standards substantially include CCITT Group 1 and Group 2 in the late 1970s, CCITT Group 3 in 1980 and CCITT Group 4 in 1984. The JBIG (Joint Bi-level Image Experts Group) founded by CCITT and ISO (International Organization for Standardization) together in 1993 further develop the bi-level image compression to the lossless compression of a black-and-white image file, such that it becomes a more universal JBIG standard.

Around 1968, P. Elias developed the Shannon-Fano coding method, constructing a much perfect Shannon-Fano-Elias coding from the mathematical view. Along the idea of such an encoding method, in 1976, J. Rissanen proposed an encoding method—arithmetic coding, which may successively approach the information entropy limit. In 1982, Rissanen and G. G. Langdon improved the arithmetic coding. Thereafter, the arithmetic coding was combined with the Prediction by Partial Matching (PPM) model proposed by J. G. Cleary and I. H. Witten in 1984.

The arithmetic coding plays an important role in the JBIG coding compression method. The output of the arithmetic coding is a real number between 0 and 1 by which the decoding terminal may uniquely decode back the original message. Before encoding, the probability of occurrence for each symbol in the message should be calculated at first.

For the lossless compression, the combination of the PPM model and the arithmetic coding may have approached to the information entropy limit to the greatest extent. Unfortunately, the arithmetic coding may obtain the shortest coding length, but the complexity per se and many floating point operations are unfavorable for the hardware implementation, and also make the arithmetic coding slow in operating. Even today with rapid change of development in the speed of the central processing unit (CPU), the operating speed of arithmetic coding programs is difficult to meet the requirements of daily applications.

SUMMARY OF THE INVENTION

In view of the above problems, the inventor has observed that there is a high probability for most of the bi-level images to have two same adjacent pixel values. For compressing to the JBIG (Joint Bi-level Image Experts Group) format, the real values corresponding to two same adjacent pixel values may be calculated within a clock cycle through the method provided by the present invention, such that the original step with two compression coding calculations may be reduced to have only one compression data calculation to obtain the same operation result.

Therefore, to achieve the above objects, a system for speeding up the arithmetic coding processing is disclosed by the present invention which comprises at least:

An input module, for reading in two adjacent pixel data and the context values (CX) thereof, and judging whether they are same or not; a memory, for storing a probability estimation table (PE table) and a speed-up table, wherein the PE table stores the prior probability values LSZs (LPS's interval sizes, wherein LPS is an abbreviation for Less Probable Symbol), and the speed-up table stores the probable values for (LSZ1+LSZ2) and (LSZ1−LSZ2) required to calculate A, C values; a selector, for determining an operation path by using a set of operation circuits (including adder(s), subtractor(s) and comparator(s)) increased internally according to the CX values of the same adjacent pixels and based on the PE table; and an output module, for calculating the A, C values by looking up the PE table and the speed-up table according to the operation path.

According to the objects of the present invention and to achieve the above advantages, a method for speeding up the arithmetic coding processing is disclosed by the present invention which comprises the following steps:

At first, reading in two pixel value data and the CX values thereof at a time; then, judging whether the two pixel values are same or not: if not, performing the compression coding calculation in the conventional arithmetic coding manner, and if yes, determining an operation path by a selector using adder(s), subtractor(s) and comparator(s) increased internally according to the CX values of the same adjacent pixels and based on the PE table; finally, calculating the A, C values by looking up the PE table and the speed-up table according to the operation path.

The features and implementation of the present invention are described in detail with reference to the accompanying drawings as follows.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein:

FIG. 6 is a probability estimation table of the present invention;

FIGS. 9a, 9b are schematic comparisons of the timing diagrams and hardware requirements of the arithmetic coding being implemented conventionally and in the present invention;

FIG. 11 is a data comparison table of the present invention implemented under various conditions.

DETAILED DESCRIPTION OF THE INVENTION

The present invention is to disclose a system for speeding up the arithmetic coding processing and method thereof. In the following detailed description of the present invention, various specific details will be described so as to provide a full illustration of the present invention. However, for those skilled in the art, the present invention may be implemented without using these specific details, or may be implemented by using an alternative element or method. In other cases, the known method, procedure, member and circuit are not specifically illustrated in detail, to avoid confusing the emphases of the present invention unnecessarily.

Figure 1:
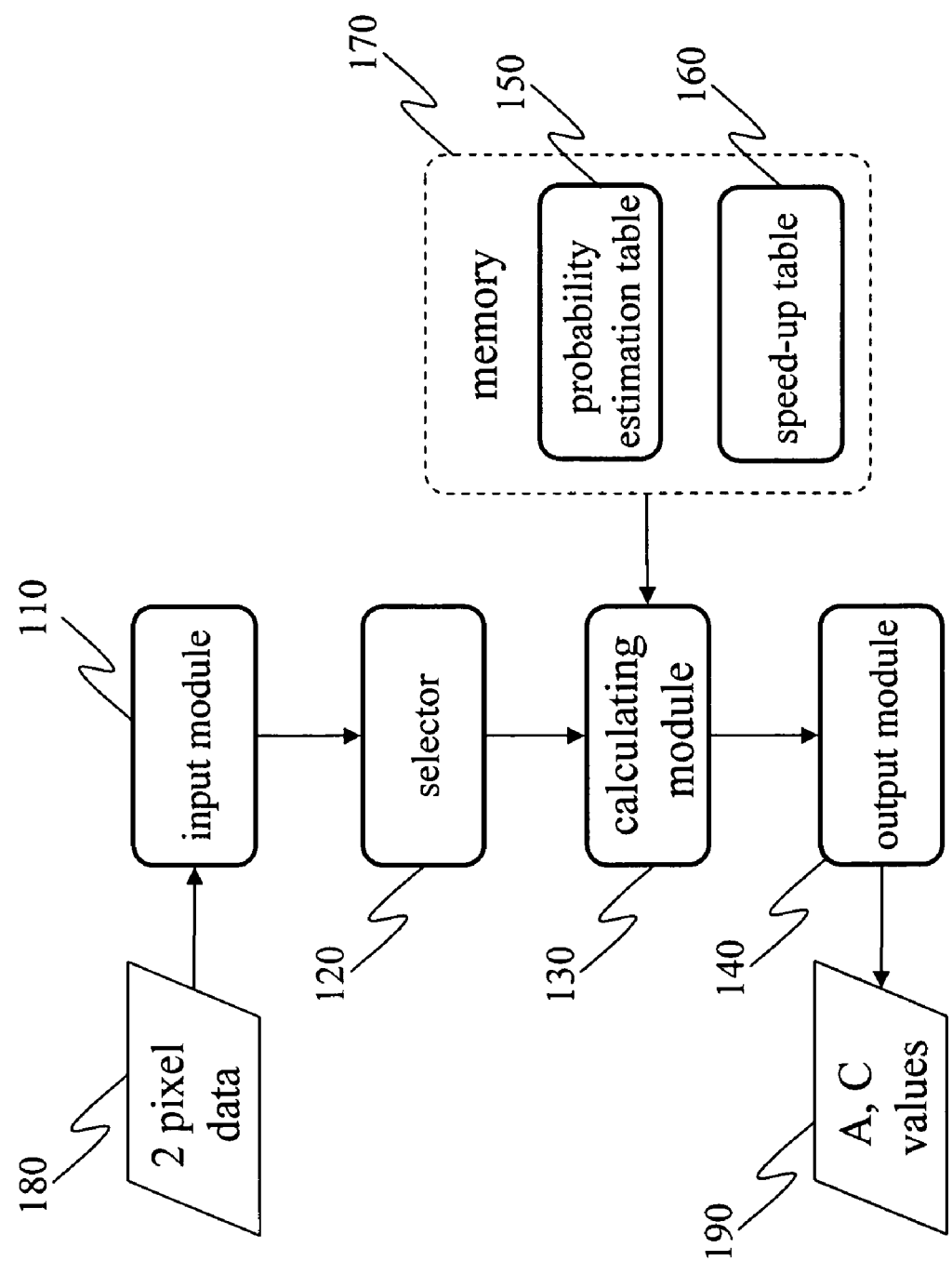
FIG. 1 is a block diagram of a system of the present invention.
Figures 2A, 2B:
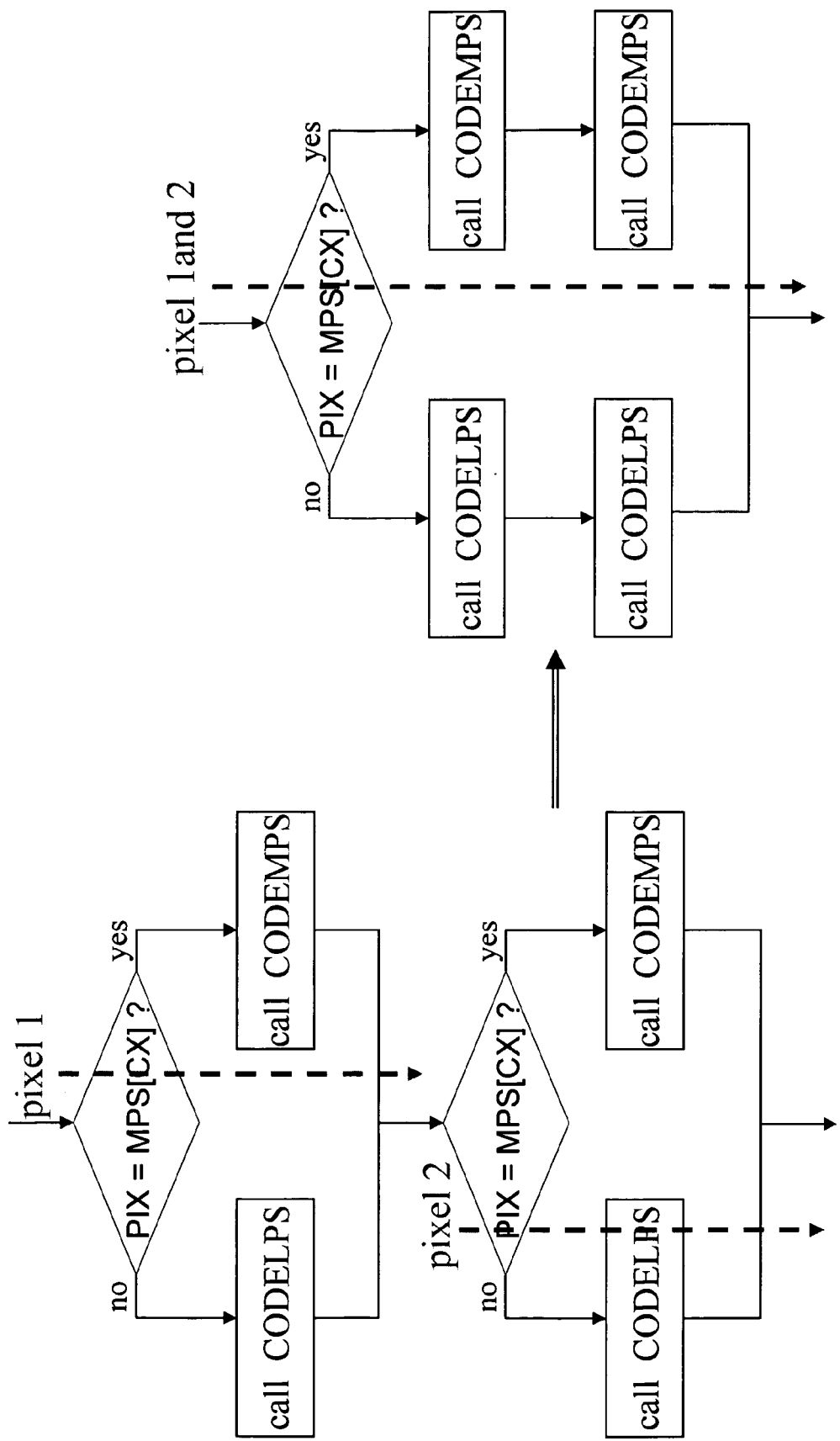
FIG. 2a is a flow chart of a conventional method for processing the arithmetic coding of 2 pixel data.
FIG. 2b is a flow chart of a method for reading two pixel data at a time to perform the arithmetic coding according to the present invention.

Referring to FIG. 1, it is a block diagram of a system of the present invention. The difference from the previous processing method is that in the past, when using the arithmetic coding to process the image compression, only one pixel data could be read at a time in a sequential manner. As shown in FIG. 2a, when reading in the pixel 1, judge whether the read-in pixel PIX is a MPS (More Probable Symbol) or not at first. If yes, call the CODEMPS to perform the operation processing; otherwise, call the CODELPS to perform the operation processing. Then, a set of A, C values 190 may be obtained.

Figures 3A, 3B:
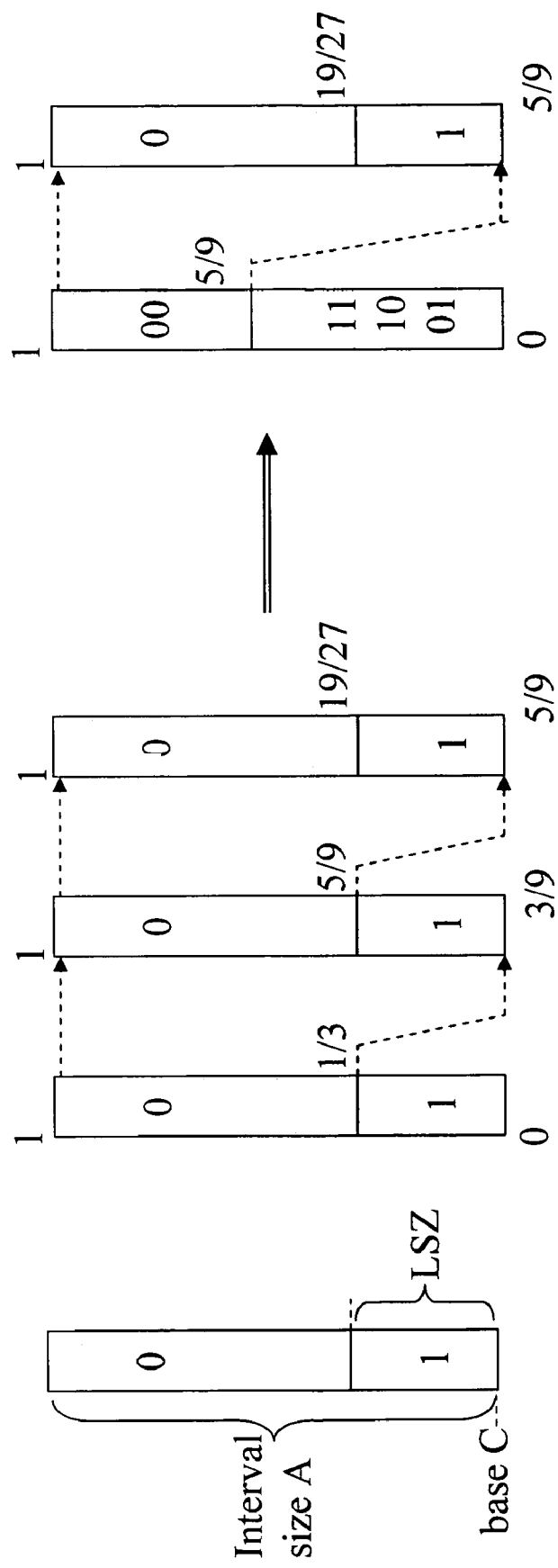
FIGS. 3a, 3b are schematic comparison diagrams of an embodiment of the arithmetic coding implemented based on the conventional method and the inventive method.
Figure 4A:
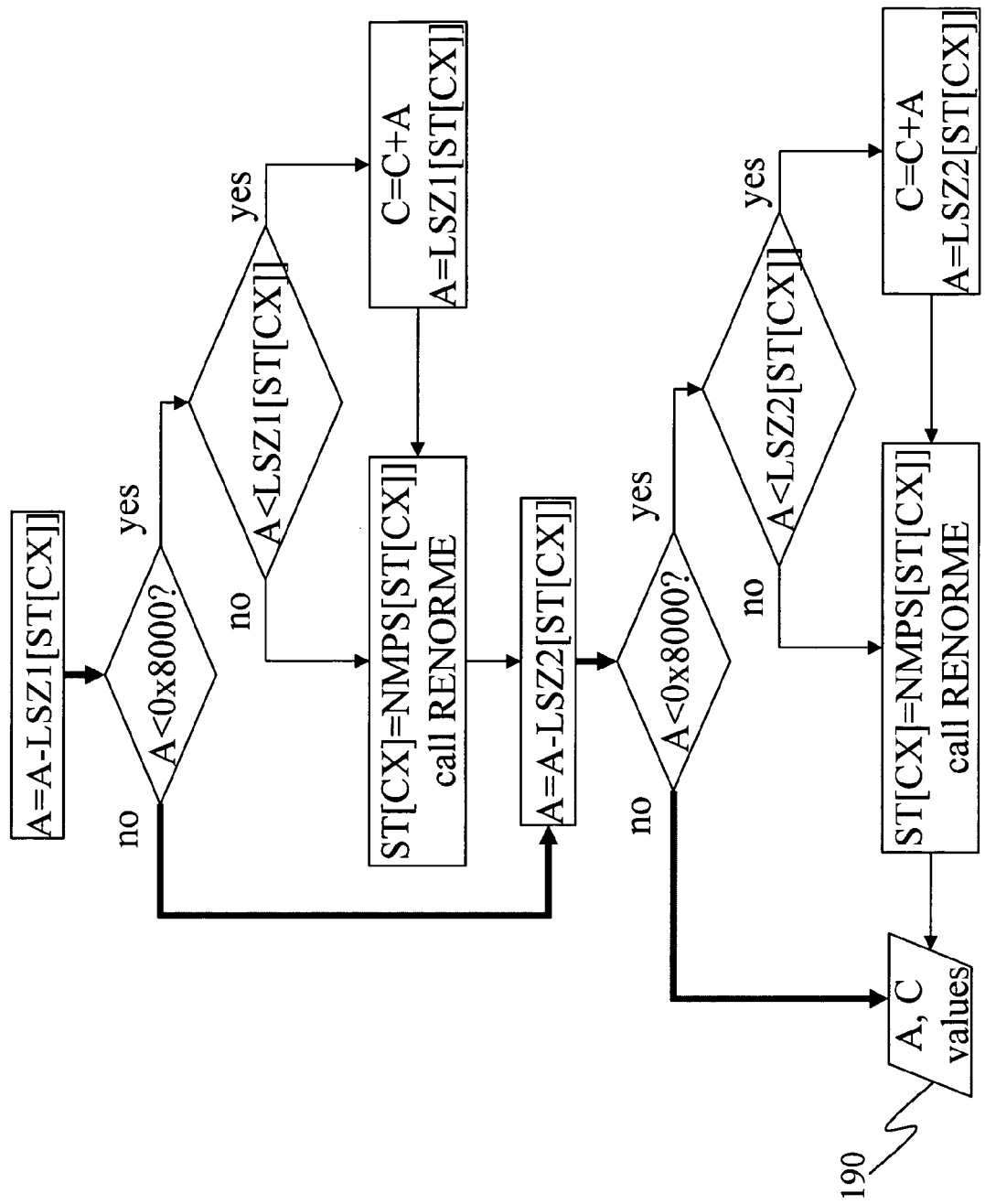
FIGS. 4a, 4b, 4c and 4d are schematic diagrams of four operation paths which may occur to change the A, C values when reading two MPS pixel data at a time to perform the arithmetic coding according to the present invention.
Figure 4B:
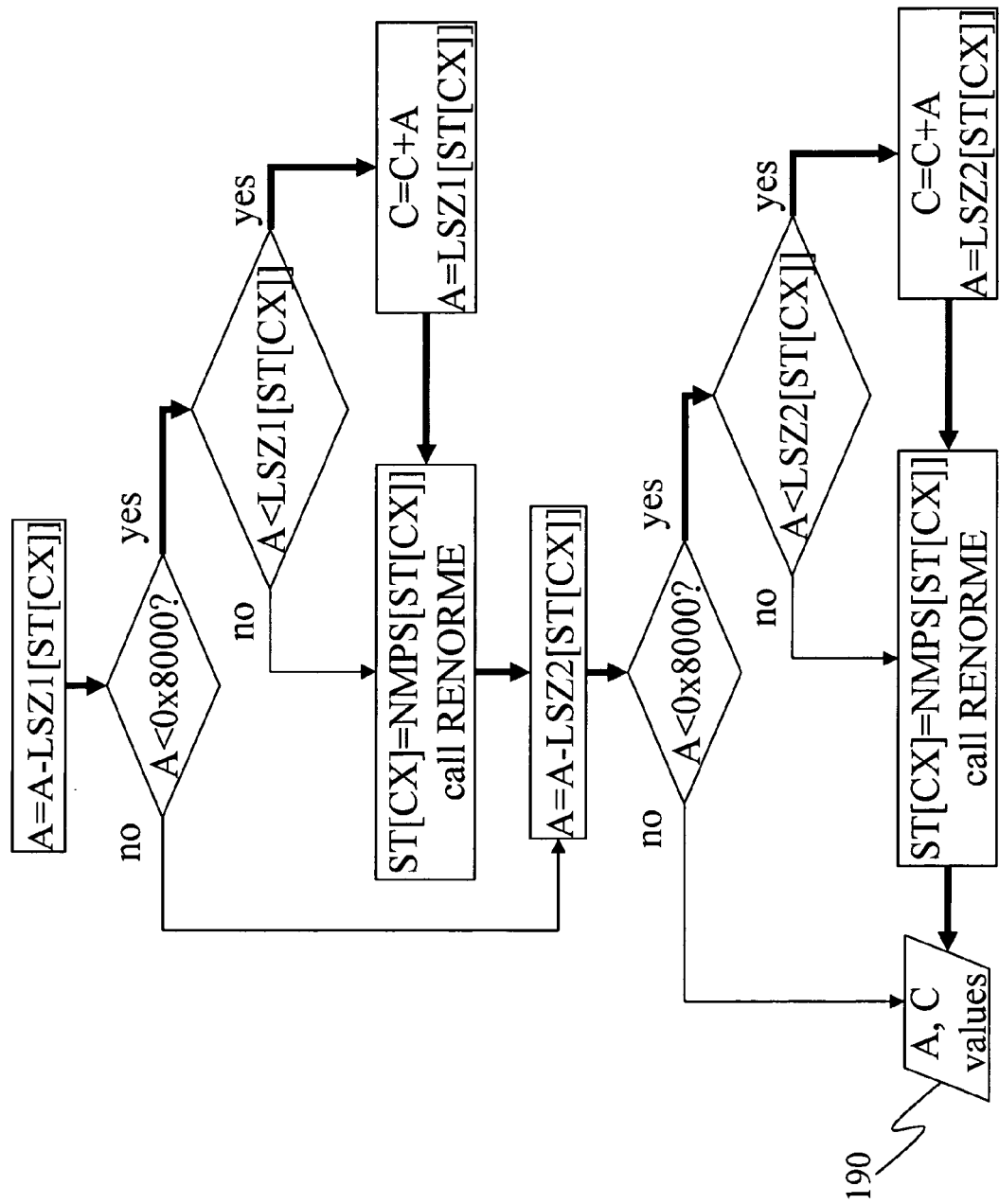
Figure 4C:
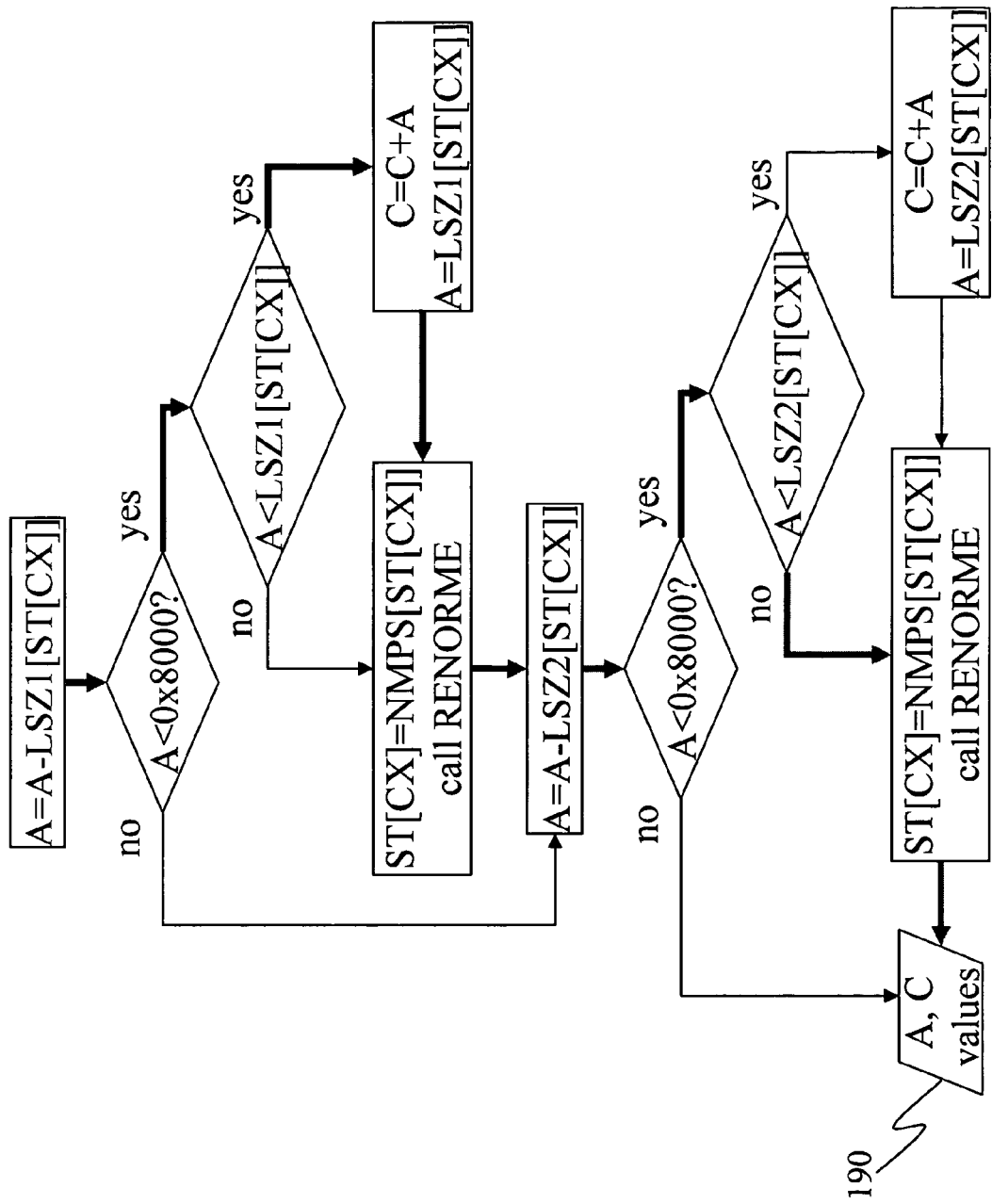
Figure 4D:
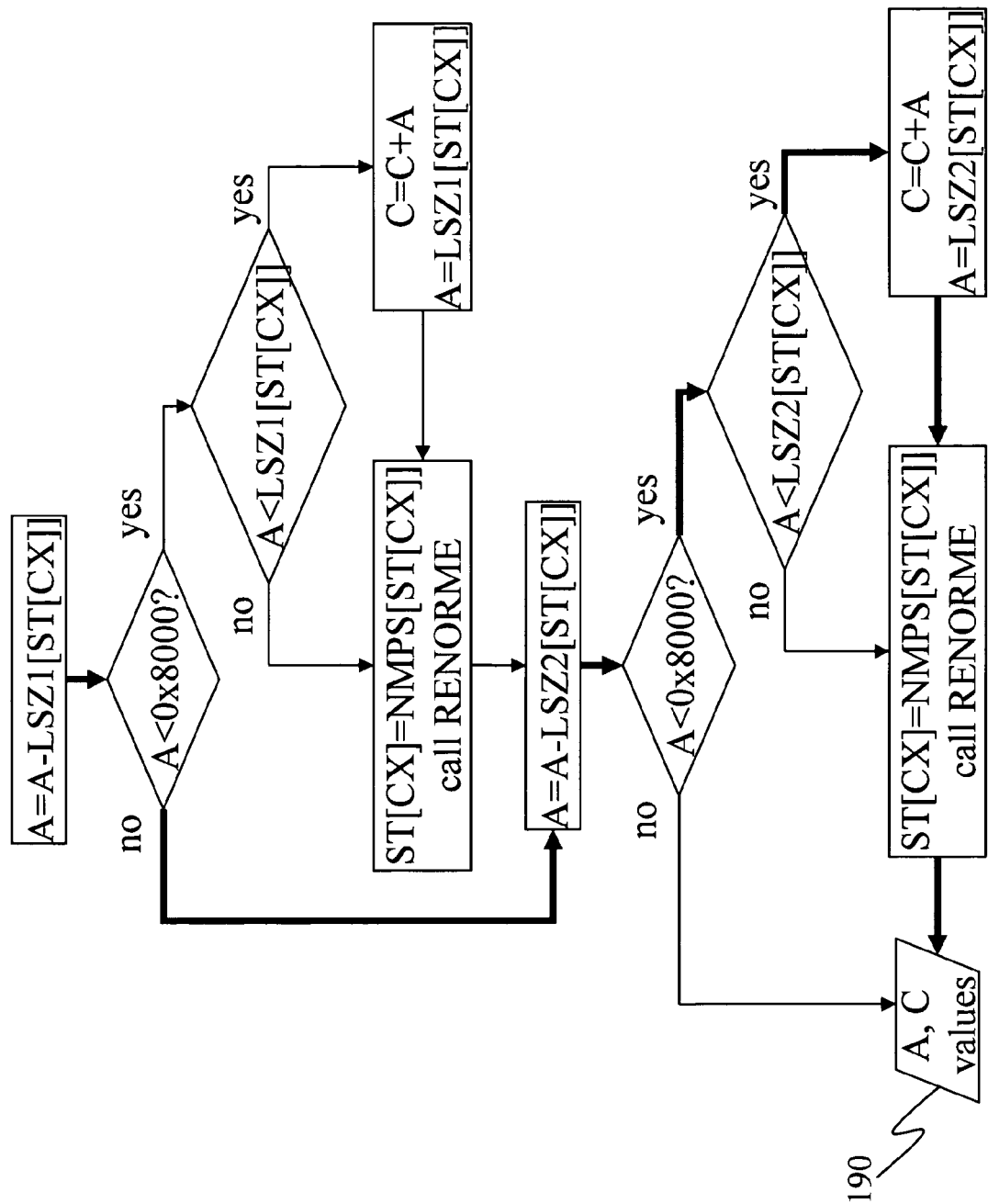

Take an embodiment for example, referring to FIG. 3a, it is a schematic diagram of sequentially processing the arithmetic coding of pixel data in a conventional manner. It is assumed that the occurrence probability of "0" is $2/3$, and the occurrence probability of "1" is $1/3$, that is LSZ=$1/3$. Therefore, when performing the first calculation, the base C is calculated from 0, and the whole interval size A is 1. Assuming that the digital image code to be encoded is "000", the first code "0" is read in firstly, and after calling the CODEMPS for calculating within the first clock cycle, it may obtain C=0 while A=1, and LSZ=$1/3$. Subsequently, the second code "0" is read in, and after calling the CODEMPS for calculating within the second clock cycle, it may obtain C=$1/3$ while A=$2/3$, and LSZ=$2/9$. Then, the third code "0" is read in, and after calling the CODEMPS for calculating within the third clock cycle, it may obtain C=$5/9$ while A=$4/9$, and LSZ=$4/27$. As known from that, when the real value obtained by the coding is between $19/27$ and 1, it is a three-code pixel data of "000".

The input module 110 of the present invention can read two pixel data 180 at a time, and if those two pixel data 180 are different, they are sequentially processed one at a time by using the conventional method mentioned above. Therefore, the input module 110 further comprises a register (not shown) to store the second pixel data temporarily which is to be processed successively after the first pixel data is processed, or a more pixel data may be read in to judge whether they are equal or not. If those two pixel data 180 are equal, as shown in FIG. 2b, it is judged whether the read-in pixels PIX are MPS or not. If yes, call the CODEMPS to perform the operation processing; otherwise, call the CODELPS to perform the operation processing. In such a way, a set of A, C values 190 for the arithmetic coding of two pixel data 180 may be obtained within a clock cycle. As shown in FIG. 3b, the input module 110 reads two pixel data "00" at a time, and after calculating within the first clock cycle, it may obtain C=0 while A=1, and LSZ=$4/9$; and after calling the CODEMPS for calculating within the second clock cycle, it may obtain C=$5/9$ while A=$4/9$, and LSZ=$4/27$.

Figure 5A:
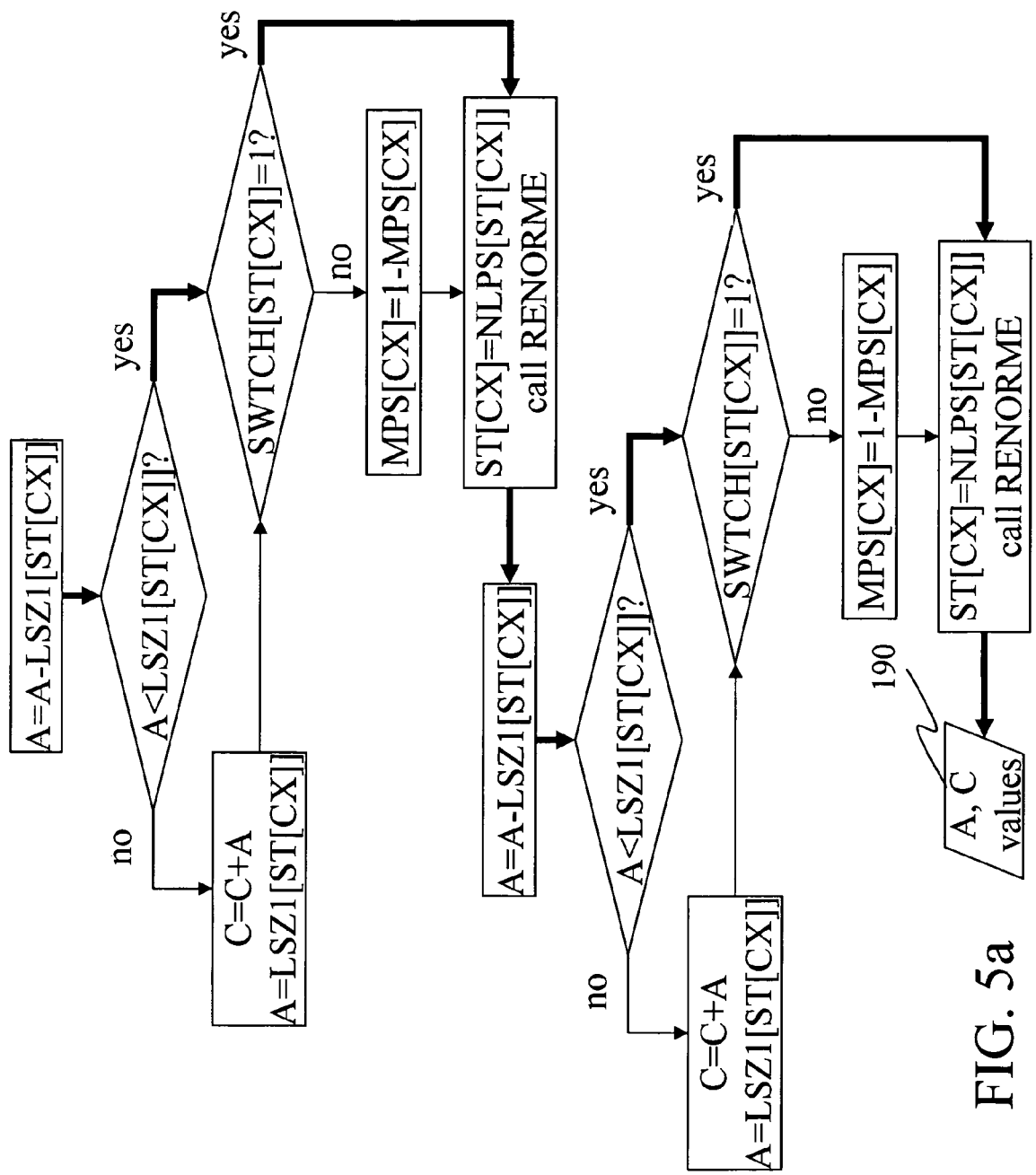
FIGS. 5a, 5b, 5c and 5d are schematic diagrams of four operation paths which may occur to change the A, C values when reading two LPS pixel data at a time to perform the arithmetic coding according to the present invention.
Figure 5B:
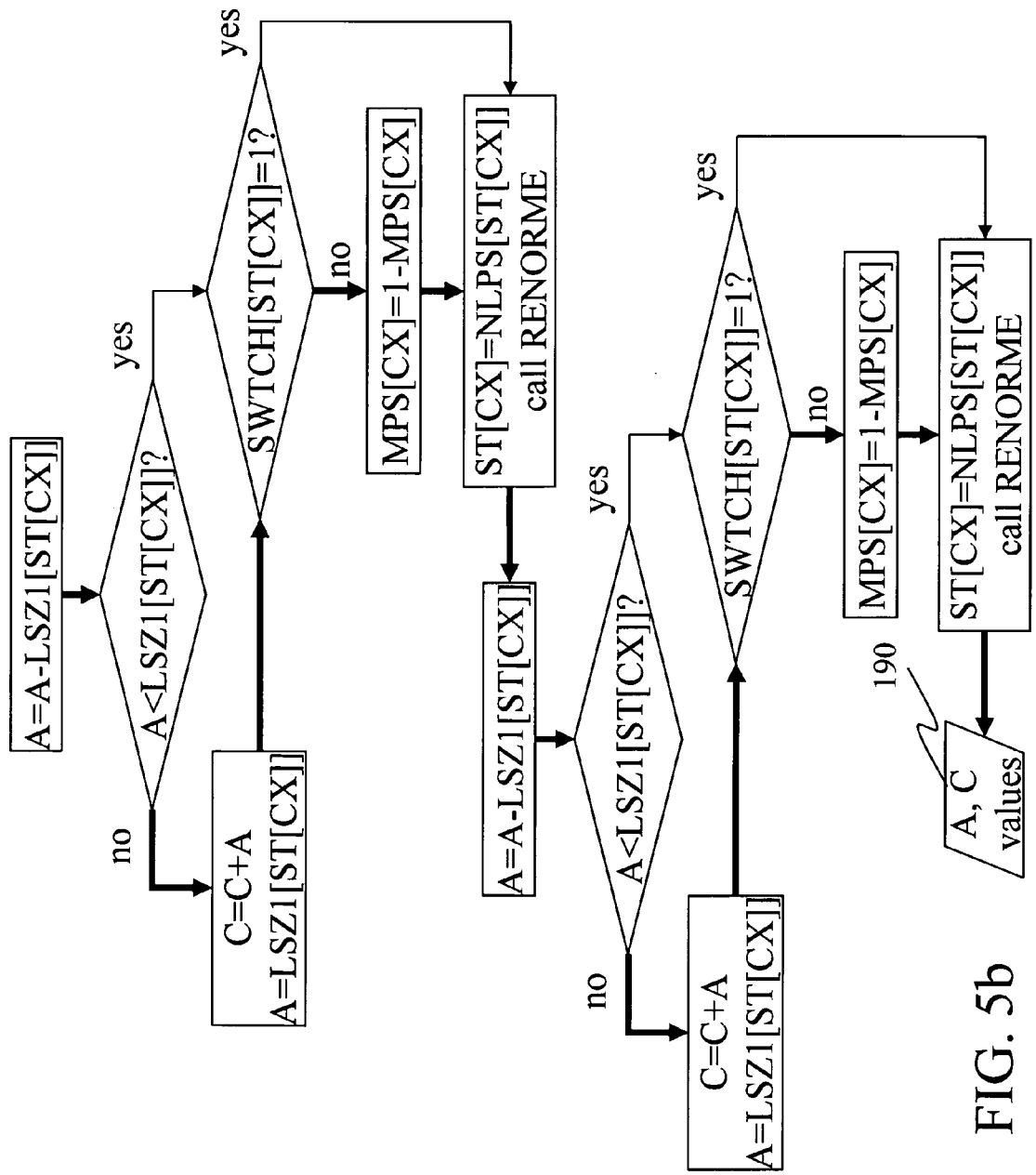
Figure 5C:
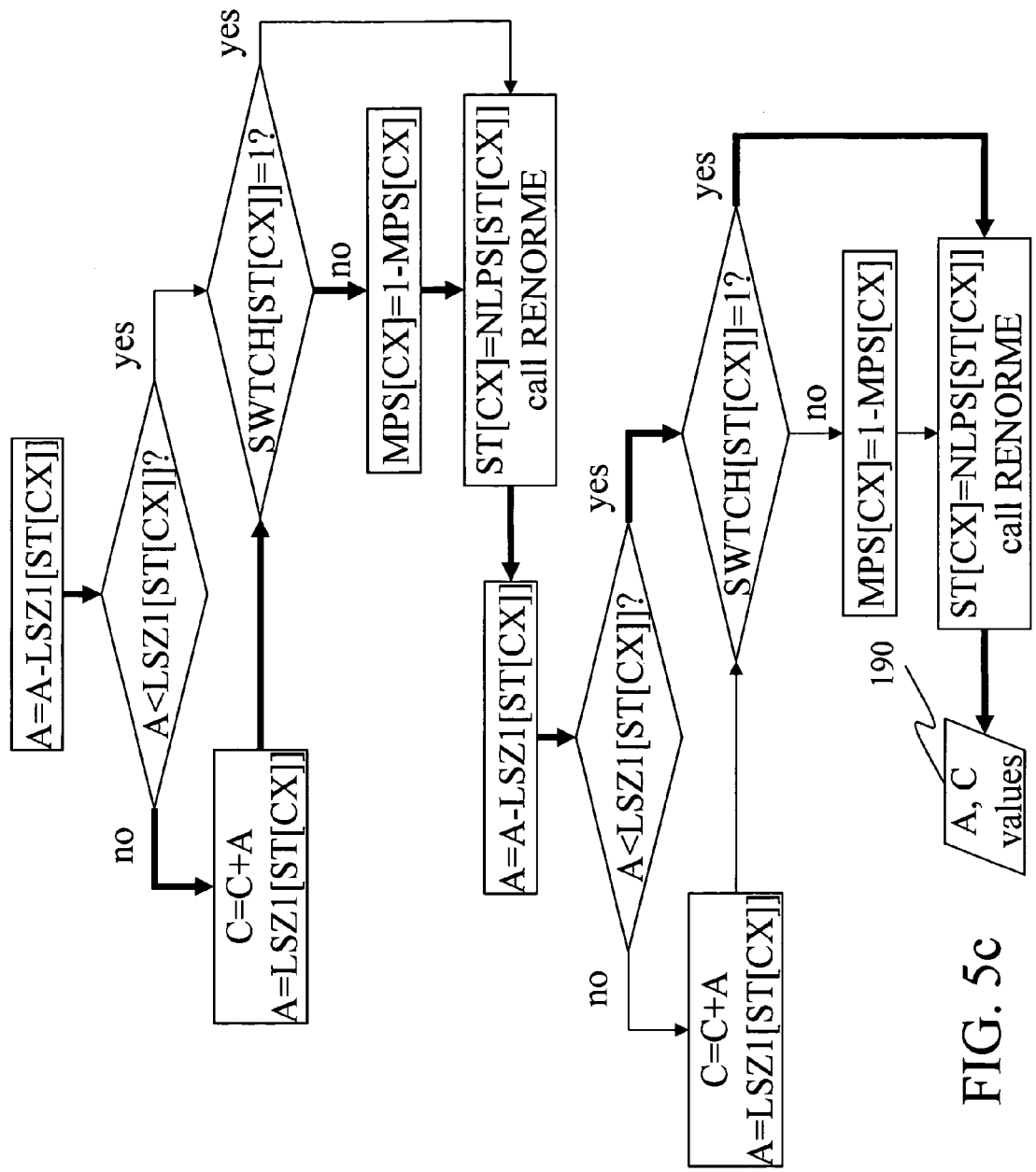
Figure 5D:
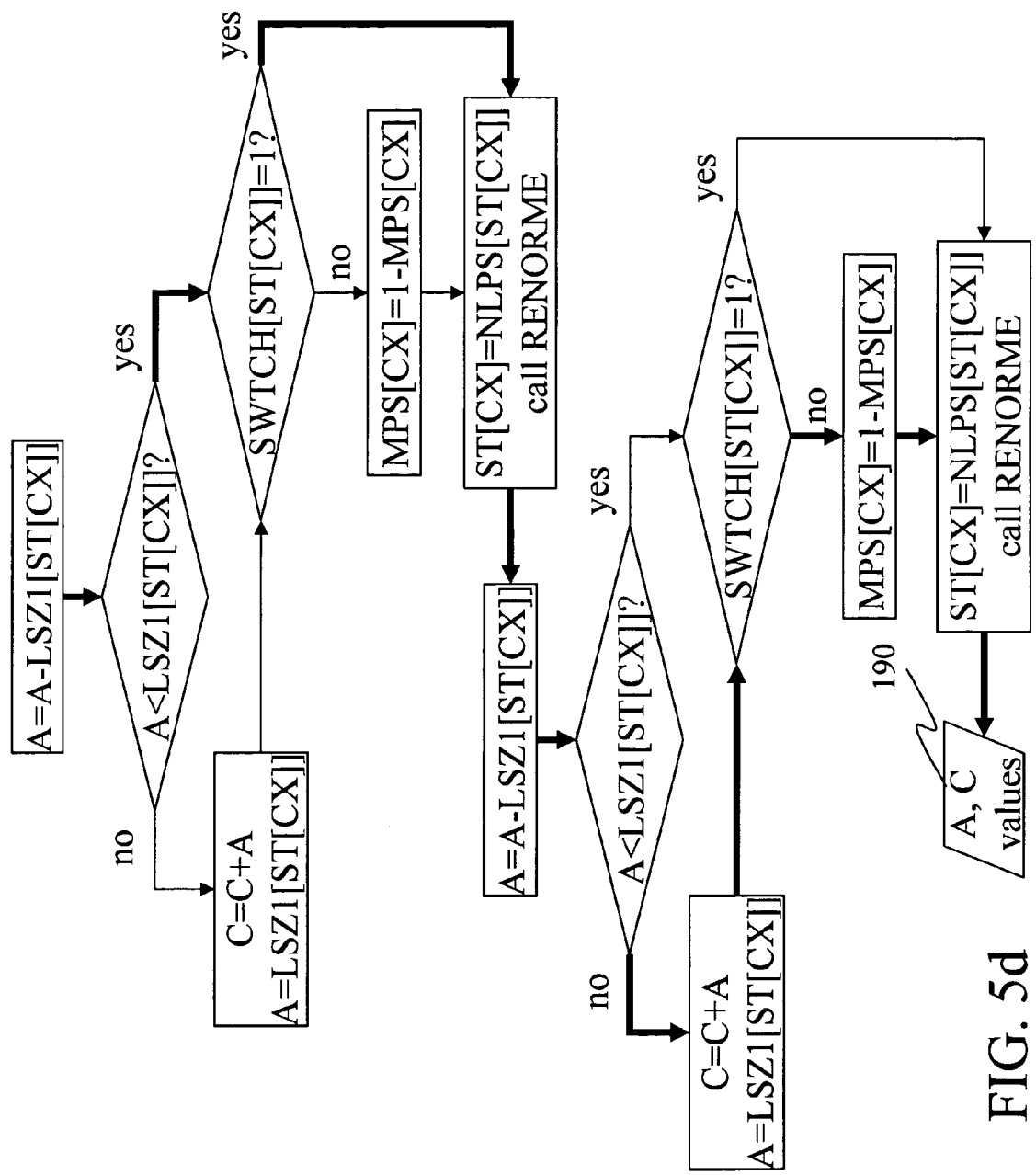

To obtain the A, C values 190 for the arithmetic coding of two pixel data 180 within a clock cycle, it should analyze the cases that the A, C values 190 might be changed by performing the CODEMPS and the CODELPS continuously. Referring to FIGS. 4a, 4b, 4c and 4d, they are schematic diagrams of four operation paths which may occur to change the A, C values 190 when reading two MPS pixel data at a time to perform the arithmetic coding. In the first operation path shown in FIG. 4a, the A value output finally is A−(LSZ1[ST[CX]]+LSZ2[ST[CX]]), while the C value keeps unchanged, wherein CX is the context value (CX) of the input pixels. In the second operation path shown in FIG. 4b, the A value output finally is LSZ2[ST[CX]], while the C value is C+2×A. In the third operation path shown in FIG. 4c, the A value output finally is (LSZ1[ST[CX]]−LSZ2[ST[CX]]), while the C value is C+A. In the fourth operation path shown in FIG. 4d, the A value output finally is LSZ2[ST[CX]], while the C value is C+A. Similarly, referring to FIGS. 5a, 5b, 5c and 5d, they are schematic diagrams of four operation paths which may occur to change the A, C values 190 when reading two LPS pixel data at a time to perform the arithmetic coding. In the first operation path shown in FIG. 5a, the A value output finally is A−(LSZ1[ST[CX]]+LSZ2[ST[CX]]), while the C value keeps unchanged. In the second operation path shown in FIG. 5b, the A value is LSZ2[ST[CX]], while the C value is C+2×A. In the third operation path shown in FIG. 5c, the A value output finally is (LSZ1[ST[CX]]−LSZ2[ST[CX]]), while the C value is C+A. In the fourth operation path shown in FIG. 5d, the A value output finally is LSZ2[ST[CX]], while the C value is C+A.

Figure 7:
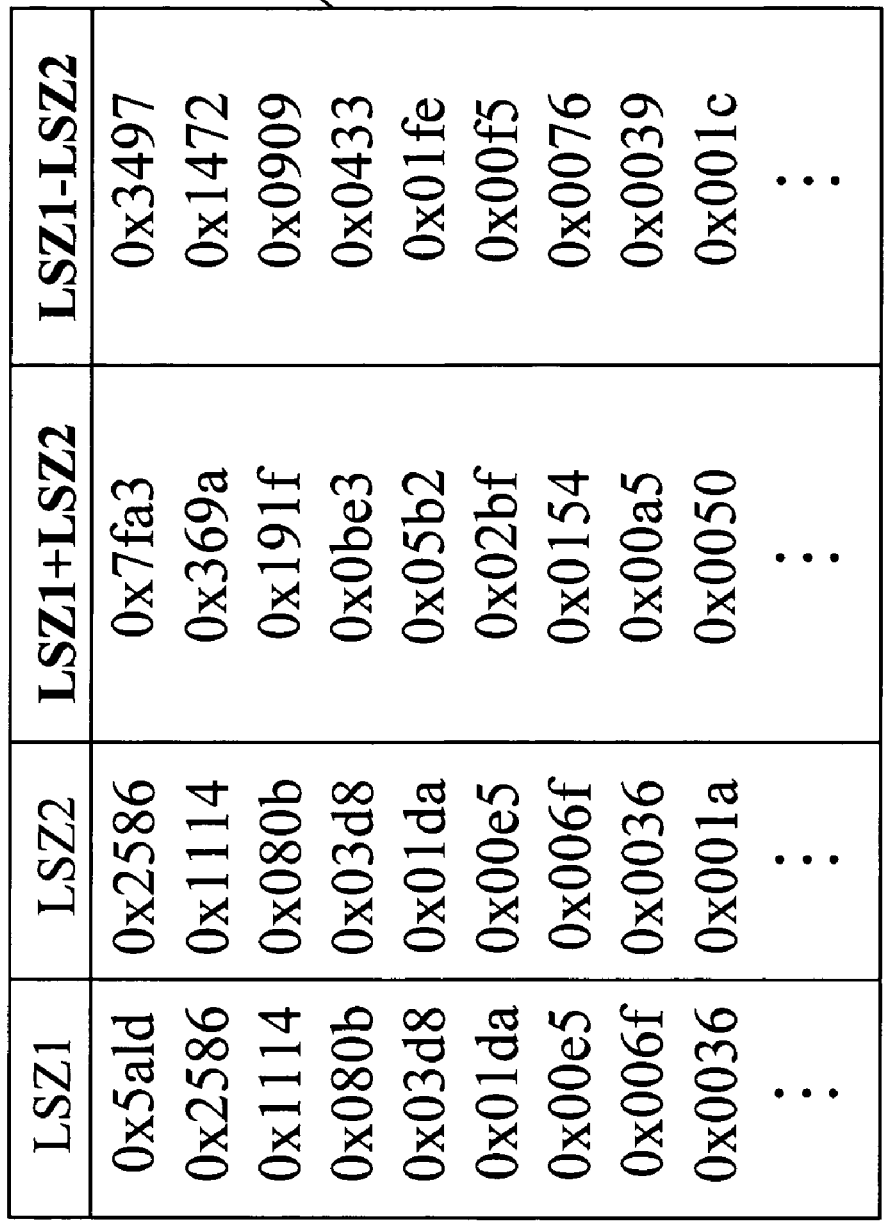
FIG. 7 is a speed-up table of the present invention.

As to the respective calculated values required for the operations, referring to FIG. 6, it is a probability estimation table (PE table) 150 stored in the memory 170, which stores the respective calculated values of LSZ, NLPS (Next LPS probability-estimation State), NMPS (Next MPS probability-estimation State) and SWTCH to be used in various operation paths, wherein when SWTCH=1, if the MPS is the pixel 1, the SWTCH will become the pixel 0. In a conventional method, each time performing the arithmetic coding of one pixel data, the A, C values 190 of a pixel data compression may be obtained by looking up the PE table 150. However, if the present invention is required to process two pixel data 180 within a clock cycle, referring to FIG. 7, a speed-up table 160 should be added into the memory 170. The calculated values stored in the table are two sets of calculated values for (LSZ1+LSZ2) and (LSZ1−LSZ2) required to calculate the A values when processing in the first operation path and the third operation path. These values are calculated in advance and stored in the memory 170, such that the selector 120 may rapidly obtain the corresponding values directly by looking up the speed-up table 160 when performing the determination of the operation path, and may select the operation path in which the two read pixel data 180 should be calculated from the four operation paths, with the aid of the increased adder(s), subtractor(s) and comparator(s).

Figure 8A:
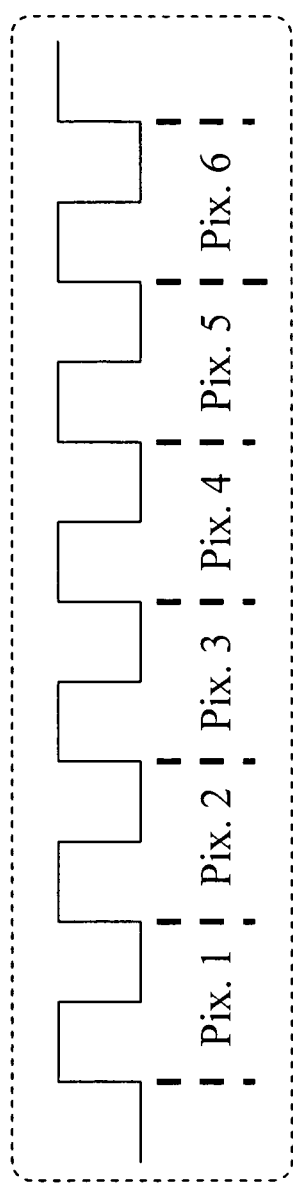
FIGS. 8a, 8b are schematic comparisons of the timing diagrams of the arithmetic coding being implemented conventionally and in the present invention.
Figure 8B:
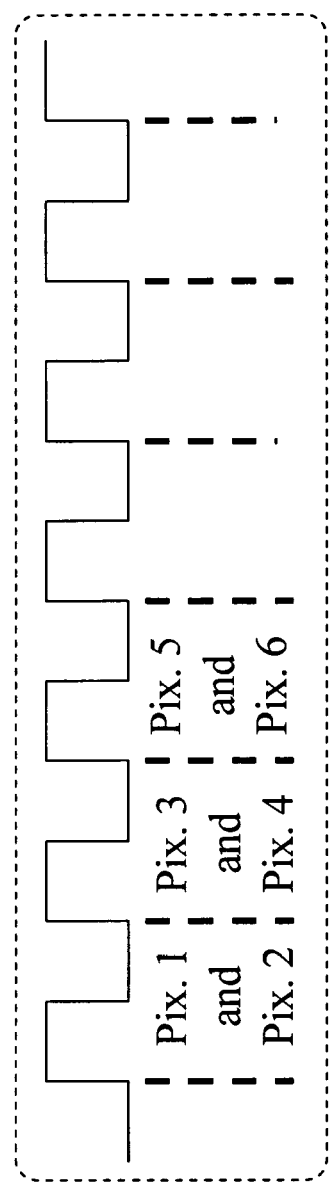

The timing diagram of a conventional calculation method is shown in FIG. 8a, wherein only one pixel data may be processed in each clock cycle. Therefore, assuming that a six-code pixel data to be processed is "001100", six clock cycles are required by the conventional method. Through the method of the present invention, referring to FIG. 8b, the calculating module 130 may process the arithmetic coding of two pixel data 180 within a clock cycle according to an operation path determined by the selector 120, and thus a total of three clock cycles is required.

Figure 10:
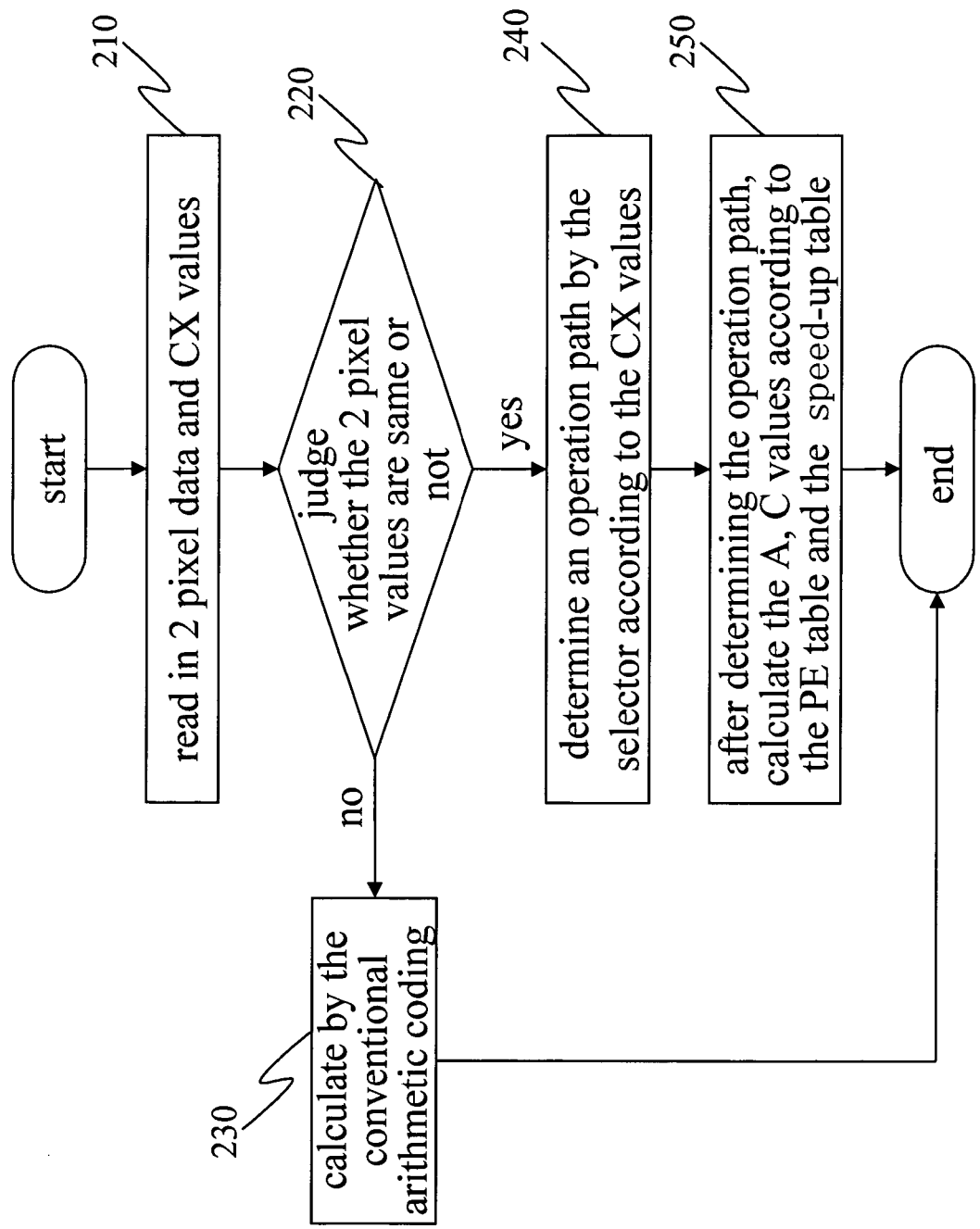
FIG. 10 is a flow chart of a method of the present invention.

For further illustration, referring to FIGS. 9a and 9b, FIG. 9a is a schematic diagram of a conventional method, in which 6 clock cycles are needed, and one adder, one subtractor and two comparators are required to process the MPS pixel data, while one adder, two subtractors and two comparators are required to process the LPS pixel data. FIG. 9b is a schematic diagram of processing the pixel data of "001100" according to the present invention, wherein four adders, eight subtractors and twelve comparators are required to process the MPS pixel data, while four adders, eleven subtractors and sixteen comparators are required to process the LPS pixel data. Referring to FIG. 10, it is a flow chart of a method according to the present invention. At first, two pixel value data and the CX values thereof are read in by the input module 110 at a time (step 210). Then, it is judged whether the two pixel values are same or not (step 220), if not, the compression coding calculation is performed by a conventional arithmetic coding method (step 230); and if yes, which operation path it belongs to in the four operation paths is determined according to the CX values of the same adjacent pixels, and is selected by the selector 120 (step 240). Then, the PE table 150 and the speed-up table 160 are looked up by the calculating module 130, so that the A, C values 190 of the 6-code bi-level image data may be calculated by the arithmetic coding method within three clock cycles, and output by the output module 140 (step 250). As two same pixel data 180 may be processed in a clock cycle, a half of the original processing time can be saved.

Therefore, referring to FIG. 11, it is apparent that, with the conventional method of arithmetic coding compression, assuming the processing speed to be one time, only two adders, three subtractors and four comparators are required, and also a PE table 150 of 128 words is required. Through many experiments, the inventor discovers that, the case that 2 same pixel data 180 are read at a time for processing has a hit rate of about 50%, but it can achieve a speed-up effect of two times in an optimal case, and can achieve an effect of speed-up by 30% in average. The requirements in hardware are increased, i.e. eight adder, nineteen subtractors and twenty-eight comparators are required, and a speed-up table 160 of 1000 bytes should be added in the memory 170, in addition to the original PE table 150 of 128 words, but it is obvious to meet the economic efficiency in terms of the increased hardware resources and the average increased effect, compared to the method for reading more than three same pixel data at a time for processing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A system for speeding up the arithmetic coding processing, comprising:
    an input module, for reading in more than two same adjacent pixel data;
    a speed-up table, for recording a plurality of probability values previously according to a probability estimation table (PE table), and calculating a plurality of probable calculated values by adding and subtracting;
    a selector, for determining an operation path from a plurality of operation paths which may change a set of A (interval size), C (base) values according to the same adjacent pixel data; and
    a calculating module, for looking up the PE table and the speed-up table to calculate the set of A (interval size), C (base) values according to the operation path.

2. The system for speeding up the arithmetic coding processing as claimed in claim 1, wherein the pixel data is a bi-level data.

3. The system for speeding up the arithmetic coding processing as claimed in claim 1, wherein the PE table comprises a plurality of calculated values for LSZ (less probable symbol's interval size), NLPS (next less probable symbol probability-estimation state), NMPS (next more probable symbol probability-estimation state) and SWTCH (switch).

4. The system for speeding up the arithmetic coding processing as claimed in claim 1, wherein the speed-up table comprises at least two sets of calculated values for (LSZ1+LSZ2) and (LSZ1−LSZ2), where LSZ stands for less probable symbol's interval size.

5. The system for speeding up the arithmetic coding processing as claimed in claim 1, wherein eight adders, nineteen subtractors and twenty-eight comparators are required for the system to read in two same adjacent pixel data for processing.

6. The system for speeding up the arithmetic coding processing as claimed in claim 5, wherein the system may achieve a processing speed of two times in an optimal case.

7. A method for speeding up the arithmetic coding processing, comprising the following steps:
    reading in more than two same adjacent pixel data;
    determining an operation path from a plurality of operation paths which may change a set of A (interval size), C (base) values according to the same adjacent pixel data; and
    looking up a PE table (probability estimation table) and a speed-up table to calculate the set of A (interval size), C (base) values according to the operation path.

8. The method for speeding up the arithmetic coding processing as claimed in claim 7, wherein the pixel data is a bi-level data.

9. The method for speeding up the arithmetic coding processing as claimed in claim 7, wherein the speed-up table comprises two sets of calculated values for (LSZ1+LSZ2) and (LSZ1−LSZ2), where LSZ stands for less probable symbol's interval size.

10. The method for speeding up the arithmetic coding processing as claimed in claim 7, wherein eight adders, nineteen subtractors and twenty-eight comparators are required for a system of the method to read in two same adjacent pixel data for processing.

* * * * *